US012763857B2

(12) United States Patent
Rekhi et al.

(10) Patent No.: US 12,763,857 B2
(45) Date of Patent: Oct. 13, 2026

(54) REMOTE PARAMETRIC DETECTION AND LOCALIZATION OF TAGS

(71) Applicant: The Board of Trustees of the Leland Stanford Junior University, Stanford, CA (US)

(72) Inventors: Angad Singh Rekhi, Stanford, CA (US); Mohammad Amin Arbabian, Stanford, CA (US); Chun-Ming Ernest So, Stanford, CA (US); Albert Gural, Clifton, VA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 201 days.

(21) Appl. No.: 17/776,193

(22) PCT Filed: Nov. 13, 2020

(86) PCT No.: PCT/US2020/060424
§ 371 (c)(1),
(2) Date: May 11, 2022

(87) PCT Pub. No.: WO2021/097214
PCT Pub. Date: May 20, 2021

(65) Prior Publication Data

US 2022/0385375 A1 Dec. 1, 2022

Related U.S. Application Data

(60) Provisional application No. 62/935,993, filed on Nov. 15, 2019.

(51) Int. Cl.
*H04B 11/00* (2006.01)
*G01S 13/86* (2006.01)
(Continued)

(52) U.S. Cl.
CPC ............ *H04B 11/00* (2013.01); *G01S 13/862* (2013.01); *G01S 13/878* (2013.01); *H03H 7/38* (2013.01)

(58) Field of Classification Search
CPC ........ G01S 13/86; G01S 13/751; G01S 7/412; G01S 13/862; G01S 13/878; H04B 5/77; H04B 7/38; H04B 11/00; H03H 7/38
(Continued)

(56) References Cited

U.S. PATENT DOCUMENTS 7,741,956 B1 * 6/2010 Nysen .................. G01S 13/755 340/10.33
8,760,261 B2 * 6/2014 Panchalan .......... G06K 7/10297 340/10.5

(Continued)

FOREIGN PATENT DOCUMENTS

JP 2006023261 A * 1/2006
WO WO-2018222777 A1 12/2018

OTHER PUBLICATIONS

JP-2006023261-A (Machine Translation) (Year: 2006).*
(Continued)

*Primary Examiner* — Yuqing Xiao
*Assistant Examiner* — Christopher Richard Walker

(57) ABSTRACT

In some example embodiments, there is provided a tag. The tag may include an antenna configured to receive a first radio frequency signal and to reradiate a second radio frequency signal; and an ultrasonic transducer coupled to the antenna, wherein an ultrasound signal received by the ultrasonic transducer causes a variation of at least one property of the ultrasonic transducer, wherein the variation of the at least one property imparts a modulation onto at least a portion of the first radio frequency signal, and wherein the modulated first radio frequency signal is reradiated by the antenna as
(Continued)

the second radio frequency signal. Related system, methods, and articles of manufacture are also disclosed.

15 Claims, 8 Drawing Sheets

(51) Int. Cl.
*G01S 13/87* (2006.01)
*H03H 7/38* (2006.01)

(58) Field of Classification Search
USPC .............................................................. 367/2
See application file for complete search history.

(56) References Cited

U.S. PATENT DOCUMENTS

| | | | | |
|---|---|---|---|---|
| 2006/0267772 | A1* | 11/2006 | Knadle, Jr. | G06K 7/02 340/572.4 |
| 2008/0009141 | A1 | 1/2008 | Dubois et al. | |
| 2008/0282817 | A1* | 11/2008 | Breed | B60C 11/24 73/865.9 |
| 2009/0277630 | A1 | 11/2009 | McDaniel et al. | |
| 2012/0296204 | A1* | 11/2012 | Ismail | A61B 5/4312 600/430 |
| 2013/0336095 | A1 | 12/2013 | Seppa et al. | |
| 2016/0105213 | A1* | 4/2016 | Hua | H04B 1/525 370/278 |
| 2017/0007200 | A1 | 1/2017 | Hagy et al. | |
| 2018/0329015 | A1* | 11/2018 | Loussert | G01S 1/82 |
| 2019/0090957 | A1* | 3/2019 | De Wijs | A61B 8/0841 |
| 2020/0380326 | A1* | 12/2020 | Kawaguchi | G06K 19/0709 |
| 2021/0153073 | A1* | 5/2021 | Hardik | H04B 1/525 |

OTHER PUBLICATIONS

Apte, N. et al., “Bandwidth and Sensitivity Optimization in CMUTs for Airborne Applications,” in Proc. IEEE Int. Ultras. Symp., Chicago, 2014, pp. 166-169.
Balanis, C. A., “Antenna Theory: Analysis and Design,” 3rd ed. Hoboken: John Wiley & Sons, 2005.
Bletsas, A. et al., “Improving Backscatter Radio Tag Efficiency,” IEEE Trans. Microw. Theory Tech., vol. 58, No. 6, pp. 1502-1509, 2010.
Dobkin, D. M. “The RF in RFID—UHF RFID in Practice,” 2nd ed. San Francisco: Elsevier, 2013.
Ericsson, “Ericsson Mobility Report Jun. 2018,” Tech. Rep., 2018. [Online]. Available: www.ericsson.com/mobility-report.
Evans, D., “The Internet of Things: How the Next Evolution of the Internet is Changing Everything,” Cisco, Tech. Rep. Apr. 2011.
Gao, H. et al., “65/30 GHZ dual-frequency wirelessly powered monolithic 1.83 mm2 wireless temperature sensor using a 3-stage inductor-peaked rectifier with on-chip antenna in 65-nm CMOS,” in Proc. IEEE Int. Microw. Symp., Philadelphia, 2018.
Ho, M.-C. et al., “Long-term measurement results of pre-charged CMUTs with zero external bias operation,” in Proc. IEEE Int. Ultras. Symp., Dresden, 2012, pp. 89-92.
“The Intelleflex XC3 Technology Platform: An Implementation of the New ISO Class 3 Standard.” [Online]. Available: https://www.fieldtechnologiesonline.com/doc/the-intelleflex-xc3-technology-platform-an-0002.
Mangal, V. et al., “A 0.42nW 434MHz-79.1dBm Wake-Up Receiver with a Time-Domain Integrator,” in Dig. IEEE Int. Solid-State Circuits Conf., San Francisco, 2019, pp. 438-439.
Moody, J. et al., “A-106dBm 33nW Bit-Level Duty-Cycled Tuned RF Wake-up Receiver,” in Dig. IEEE VLSI Symp., Kyoto, 2019, pp. C86-C87.
Pekaf, M. et al., “Frequency Tuning of Collapse-Mode Capacitive Micromachined Ultrasonic Transducer,” Ultrasonics, vol. 74, pp. 144-152, 2017.
Rekhi, A. S. et al., “A 14.5mm2 8nW-59.7dBm-sensitivity ultrasonic wake-up receiver for power-, area-, and interference-constrained applications, ” in Dig. IEEE Int. Solid-State Circuits Conf., San Francisco, 2018, pp. 454-456.
Rekhi, A. S. et al., “Ultrasonic Wake-Up With Precharged Transducers,” IEEE J. Solid-State Circuits, vol. 54, No. 5, pp. 1475-1486, 2019.
Rekhi, A. S. et al., “Wireless Power Transfer to Millimeter-Sized Nodes Using Airborne Ultrasound,” IEEE Trans. Ultras. Ferro. Freq. Control, vol. 64, No. 10, pp. 1526-1541, 2017.
Soneson, J., “HITU Simulator,” 2017. [Online]. Available: https://www.fda.gov/about-fda/cdrh-offices/hitu-simulator.
Tabesh, M. et al., “A Power-Harvesting Pad-Less Millimeter-Sized Radio,” IEEE J. Solid-State Circuits, vol. 50, No. 4, pp. 962-977, 2015.
“The Thing: Great Seal Bug,” 2019. [Online]. Available: https://cryptomuseum.com/covert/bugs/thing/index.htm.
Wang, P. H. P. et al., “A 220μW -85dBm Sensitivity BLE-Compliant Wake-up Receiver Achieving -60dB SIR via Single-Die Multi-Channel FBAR-Based Filtering and a 4-Dimentional Wake-Up Signature,” in Dig. IEEE Int. Solid-State Circuits Conf., San Francisco, 2019, pp. 440-442.

* cited by examiner

REMOTE PARAMETRIC DETECTION AND LOCALIZATION OF TAGS

CROSS REFERENCE TO RELATED APPLICATIONS

This application is a national phase entry of Patent Cooperation Treaty Application PCT/US20/60424 filed Nov. 13, 2020, entitled "REMOTE PARAMETRIC DETECTION AND LOCALIZATION OF TAGS," which claims the benefit of priority to U.S. Provisional Patent Application No. 62/935,993, filed on Nov. 15, 2019, and entitled "REMOTE PARAMETRIC DETECTION, LOCALIZATION, AND IDENTIFICATION OF PASSIVE TAGS," the disclosures of which are incorporated herein by reference in their entirety.

STATEMENT OF GOVERNMENT SUPPORT

This invention was made with government support under contract FA9550-11-C-0028 awarded by Department of Defense, Air Force, Office of Scientific Research, National Defense Science and Engineering. The government has certain rights in the invention.

FIELD

The subject matter disclosed herein related to detection and localization of tags.

SUMMARY

In some example embodiments, there is provided a tag. The tag may include an antenna configured to receive a first radio frequency signal and to reradiate a second radio frequency signal; and an ultrasonic transducer coupled to the antenna, wherein an ultrasound signal received by the ultrasonic transducer causes a variation of at least one property of the ultrasonic transducer, wherein the variation of the at least one property imparts a modulation onto at least a portion of the first radio frequency signal, and wherein the modulated first radio frequency signal is reradiated by the antenna as the second radio frequency signal.

In some variations one or more of the features disclosed herein including one or more of the following can optionally be included. The at least one property may be an electrical property of the ultrasonic transducer. The electrical property may include at least an impedance of the ultrasonic transducer. The tag may further include at least one matching circuit to provide impedance matching between the antenna and the ultrasonic transducer. The radio frequency signal may include a continuous wave radio frequency signal. The ultrasound may include a pulsed signal. The ultrasonic transducer may include a piezoelectric transducer or a capacitive transducer. The ultrasonic transducer may include a capacitive micromachined ultrasonic transducer. The tag may be passive, such that the tag does not include a battery and/or a powered, active component. The tag may include a plurality of antennas. The tag may include a plurality of ultrasonic transducers.

In some example embodiments, there is provided a system including an ultrasonic transducer configured to transmit an ultrasound signal towards a tag being located by the system; an antenna configured to transmit a first radio frequency signal towards the tag and receive a second radio frequency signal from the tag, the second radio frequency signal including a modulation caused by the ultrasound signal received by the tag; and detection circuitry to detect the modulation and provide an indication of a presence of the modulation on the received second radio frequency signal and/or an indication of a distance to the tag.

In some variations one or more of the features disclosed herein including one or more of the following can optionally be included. The indication of a distance may correspond to the measured time for the ultrasound signal to travel from the system to the tag. The detection circuitry may include digital down conversion circuitry. The system may further include a circulator coupled to the antenna; self-interference cancellation circuitry coupled to the circulator; and an analog-to-digital converter coupled to the self-interference circuity and the detection circuitry. The system may include a plurality of antennas. The system may include a plurality of ultrasonic transducers. The ultrasonic transducer may include a plurality of ultrasonic transducers. The system may include a plurality of tags. At least one of the tags may be passive, such that the tag does not include a battery and/or a powered, active device.

In some example embodiments, there is provided a tag. The tag may include an antenna configured to receive a first radio frequency signal and to reradiate a second radio frequency signal; and a photodiode coupled to the antenna, wherein an optical signal received by the photodiode imparts a modulation onto at least a portion of the first radio frequency signal, and wherein the modulated first radio frequency signal is reradiated by the antenna as the second radio frequency signal.

In some variations one or more of the features disclosed herein including one or more of the following can optionally be included. The at least one property may be an electrical property of the photodiode. The electrical property may include at least an impedance of the photodiode. The tag may include at least one matching circuit to provide impedance matching between the antenna and the photodiode. The radio frequency signal may include a continuous wave radio frequency signal. The optical signal may include a modulated signal. The photodiode may include a silicon p-n junction diode. The tag may be passive, such that the tag does not include a battery and/or a powered, active component.

In some example embodiments, there is provided a system including an optical emitter configured to transmit an optical signal towards a tag being located by the system; an antenna array configured to transmit a first radio frequency signal towards the tag and receive a second radio frequency signal from the passive tag, wherein the second radio frequency signal includes a modulation caused by the optical signal received by the tag; and detection circuitry configured to detect the modulation and provide an indication of a presence of the modulation and/or an indication of a distance to the tag.

In some variations one or more of the features disclosed herein including one or more of the following can optionally be included. The indication of a distance may correspond to the measured time for the optical signal to travel from the system to the tag and for the reradiated radio frequency signal to travel back from the tag to the system. The detection circuitry may include digital down conversion circuitry. The system may include a circulator coupled to the at least one antenna; self-interference cancellation circuitry coupled to the circulator; and an analog-to-digital converter coupled to the self-interference circuity and the detection circuitry. At least one optical emitter may include an array of optical emitters. The system may include a plurality of tags. At least one of the tags may be passive, such that the tag does not include a battery and/or a powered, active device.

In some example embodiments, there is provided a method including receiving, by an antenna at a tag, a first radio frequency signal; and transmitting, by the antenna at the tag, a second radio frequency signal, wherein the second radio frequency signal is varied by an ultrasound signal received by an ultrasonic transducer coupled to the antenna and/or varied by an optical signal received by a photodiode at the tag.

In some example embodiments, there is provided a method including transmitting a first signal towards a tag being located by the system, the first signal comprising an ultrasound signal generated by an ultrasonic transducer and/or an optical signal generated by an optical emitter; transmitting, by at least one antenna, a first radio frequency signal towards the tag; receiving a second radio frequency signal from the tag, the second radio frequency signal including a modulation caused by the ultrasound signal that is received by the tag and/or the optical signal that is received by the tag; and detecting the modulation and providing an indication of a presence of the modulation on the received second radio frequency signal and/or an indication of a distance to the tag.

Implementations of the current subject matter can include systems and methods consistent including one or more features described herein as well as articles that comprise a tangibly embodied machine-readable medium operable to cause one or more machines (e.g., computers, etc.) to result in operations described herein. Similarly, computer systems are also described that may include one or more processors and one or more memories coupled to the one or more processors. A memory, which can include a computer-readable storage medium, may include, encode, store, or the like one or more programs that cause one or more processors to perform one or more of the operations described herein. Computer implemented methods consistent with one or more implementations of the current subject matter can be implemented by one or more data processors residing in a single computing system or multiple computing systems. Such multiple computing systems can be connected and can exchange data and/or commands or other instructions or the like via one or more connections, including but not limited to a connection over a network (e.g. the Internet, a wireless wide area network, a local area network, a wide area network, a wired network, or the like), via a direct connection between one or more of the multiple computing systems, etc.

The details of one or more variations of the subject matter described herein are set forth in the accompanying drawings and the description below. Other features and advantages of the subject matter described herein will be apparent from the description and drawings, and from the claims. It should be readily understood that such features are not intended to be limiting. The claims that follow this disclosure are intended to define the scope of the protected subject matter.

DESCRIPTION OF THE DRAWINGS

The accompanying drawings, which are incorporated in and constitute a part of this specification, show certain aspects of the subject matter disclosed herein and, together with the description, help explain some of the principles associated with the disclosed implementations. In the drawings.

Figure 1:
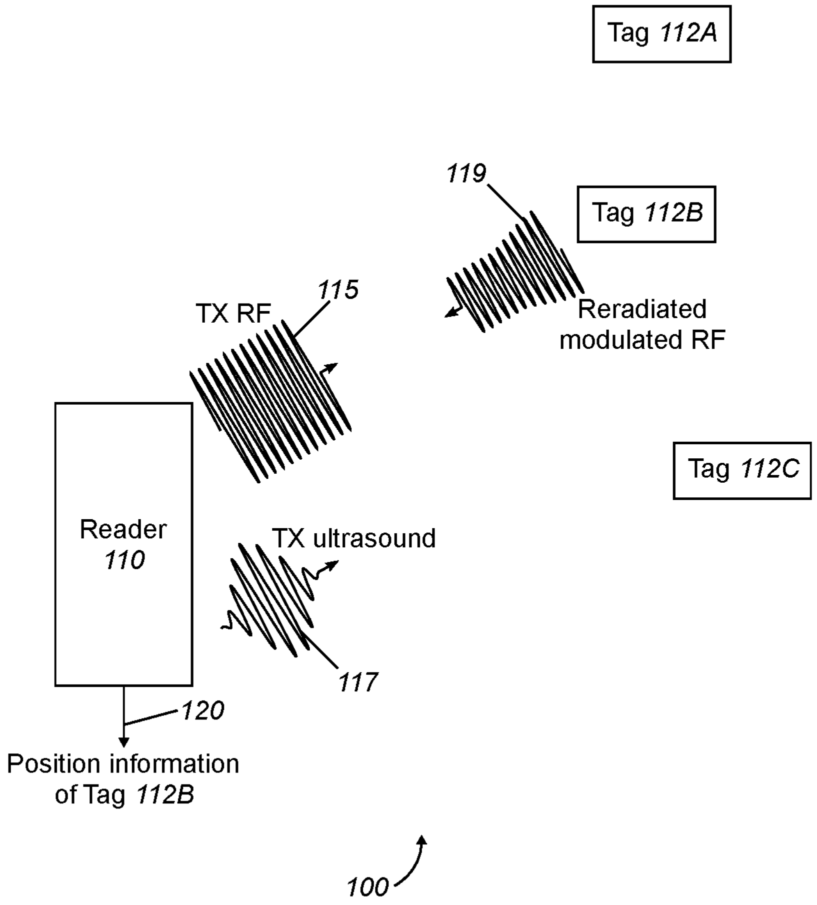
FIG. 1 depicts an example of a tag localization system including a reader and passive tags, in accordance with some example embodiments.

When practical, like labels are used to refer to same or similar items in the drawings.

DETAILED DESCRIPTION

FIG. 1 depicts an example of a tag localization system 100, in accordance with some example embodiments. The system 100 may include a reader 110 and a plurality of tags, such as tags 112A-C. The reader may transmit a radio frequency (RF) signal 115 and an ultrasound signal (or more simply ultrasound) 117. The RF signal and ultrasound may be received by at least one of the tags, such as tag 112B. When the tag 112B receives (e.g., detects) the ultrasound, the ultrasound (which changes the properties of the ultrasound transducer 266) modulates the RF signal received at the tag 112B, such that the reradiated RF return signal 119 carries the modulation caused by the ultrasound. As described further herein, as the ultrasound transducer's properties are changed by the received ultrasound, the reradiated RF return signal is modulated. For example, if the radio frequency (RF) signal 115 is centered at 145 MHz ($f_{RF}$), the reradiated RF return signal will be centered at 145 MHz ($f_{RF}$) and include a first RF sideband at 145 MHz plus the frequency of the ultrasound ($f_{US}$) and a second RF sideband at 145 MHz minus the frequency of the ultrasound ($f_{US}$). The reader 110 receives the RF return signal 119 and may detect the presence of the sidebands caused by the ultrasound modulation (e.g., using matched filter detection or another type of detection). The time a sideband is detected may be used to determine an estimate for the time for the ultrasound 117 to travel from the reader 110 to tag 112B. This travel time directly corresponds to an estimated distance between the reader 110 and tag 112B. In this way, the reader 110 may be used to determine and thus provide the location or position information, such as distance, for tag 112B. In some embodiments, the ultrasound signal may create a single sideband in the reradiated RF signal 115 at either 145 MHz plus the frequency of the ultrasound or 145

MHz minus the frequency of the ultrasound, but the reader 110 may detect the presence of a single sideband and/or use its time-of-arrival to determine an estimate for the distance to the tag 112B.

Although FIG. 1 depicts a single reader, the tag localization system 100 may include a plurality of readers as well. Moreover, although three tags are depicted at FIG. 1, other quantities of tags may be implemented as well.

Figure 2:
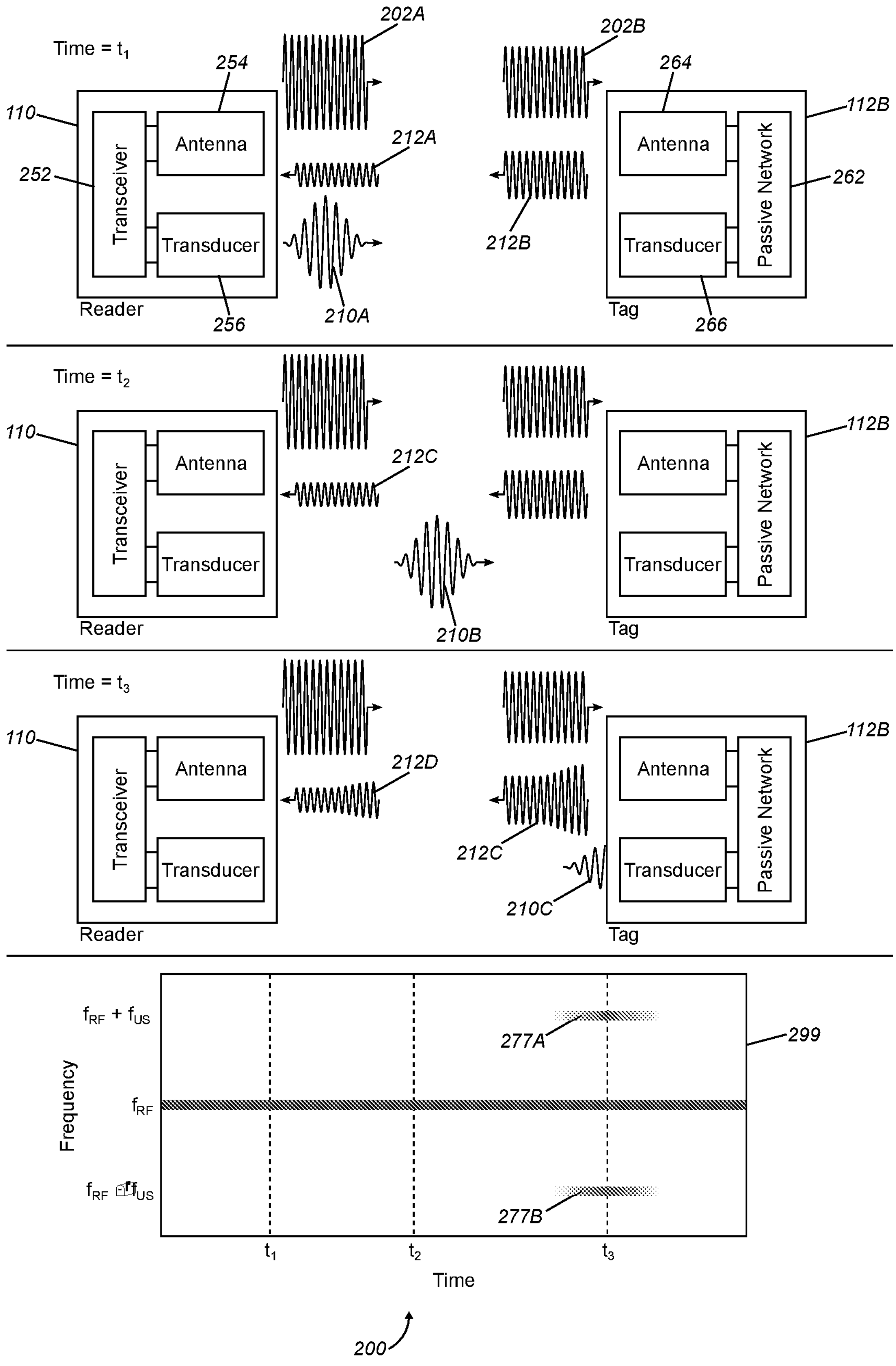
FIG. 2 depicts examples of the state of the reader and a tag over time including a plot of received signals, in accordance with some example embodiments.

FIG. 2 depicts the reader 110 and tag 112B over time, such as times $t_1$, $t_2$, and $t_3$, and a spectrogram plot 299 of the received RF return signal that includes those times, in accordance with some example embodiments.

The reader 110 may include transceiver circuitry 252 configured to generate RF and ultrasound signals for transmission and to detect from the return RF signal the sidebands (which were introduced at the tag by the modulation caused by the ultrasound), an RF antenna 254 configured to transmit RF signals towards one or more tags and receive RF return signals from the one or more tags 112A-C, and an ultrasonic transducer 256 configured to transmit ultrasound towards the one or more tags, in accordance with some example embodiments.

In some example embodiments, the reader 110 may transmit the RF signals as a continuous wave (CW) RF transmission. In some example embodiments, the reader transmits the ultrasound in pulses. Alternatively, or additionally, the RF signals or ultrasound signals may be chirped, in which case the transmitted signals may increase (or decrease) in frequency over time. The use of chirping may enable the reader to detect the velocity of the tag based on the Doppler effect (e.g., the carrier frequency and the modulation frequency of the return RF signal will be shifted by an amount proportional to the velocity of the tag). The pulse shape of the ultrasound signal may be a raised cosine waveform, a sinc waveform, and/or a Gaussian waveform, although other types of pulse shapes may be used as well. The ultrasound may be configured to have a pulse bandwidth of 10 Hz to 100 kHz, although other bandwidths may be used as well. And, the ultrasound may be configured to have a pulse repetition frequency (PRF) of 0.1 Hz to 10 kHz, although other PRFs may be used as well.

In some example embodiments, the one or more tags 112A-C may each include an RF antenna 264 configured to receive the RF signals transmitted by the reader 110 and to reradiate the RF return signals toward the reader. The tag may also include an ultrasonic transducer 266 configured to receive the ultrasound signal transmitted by the reader. Moreover, the tag may include passive circuitry 262 (labeled "Passive Network") configured to passively convert the variation of the ultrasound transducer due to incident ultrasound into a modulation of the reradiated RF signal. As such, the tag's reradiated RF return signal is modulated by the ultrasound signal at the frequency of the ultrasound (e.g., $f_{US}$), which may be pulsed as described above.

In some example embodiments, the tags 112A-C are passive. Passive in this context refers to the tags not having an independent power source, such as a battery. In other words, each tag receives, modulates, and reradiates the return RF signal without active, powered components, such as amplifiers. Moreover, these passive tags do not include active devices, GPS location circuity, or processors that allow the tag itself to determine its location (or distance to or from the reader) and then provide the location or distance to the reader. In other words, a passive tag reradiates the received RF signal to enable the reader to determine the location of the tag.

At time $t_1$, the reader 110 transmits a CW RF signal 202A at frequency $f_{RF}$ and power $P_{RF,Tx}$ and transmits a pulse of ultrasound 210A with ultrasonic carrier frequency $f_{US}$. As RF signals travel at the speed of light while sound, including ultrasound, travels much slower than light, the tag 112B may receive the CW RF signal 202B before any of the ultrasound is detected by the tag 112B. At time $t_1$, the reradiated RF signal 212B may represent the received RF signal 202B with corresponding amplitude losses and/or a phase shift. This reradiated RF signal 212B is subsequently received (as shown at 212A) by the reader (with additional losses and phase shift). At time $t_2$, the tag 112B is still waiting for the ultrasound pulse 210B to be received by a tag.

At time $t_3$, however, the pulse of ultrasound 210C arrives at the tag 112B after a time delay. This delay is based on the distance, z, between the reader 110 and the tag 112B, and the speed of sound $c_{us}$. In other words, the distance, z, is equal to the time delay multiplied by the speed of the ultrasound. The incident ultrasound 210C is received by the ultrasonic transducer 266 at the tag 112B. The received ultrasound wave 210C varies the properties (e.g., electrical properties such as impedance, capacitance, and/or the like) of the transducer 266. This variation modulates the impedance load seen by the tag's RF antenna 264 and passive circuitry network 262, such that the modulation creates sidebands in a reradiated RF signal 212C. The reradiated return signal 212C is centered at $f_{RF}$ with a first sideband at $f_{RF}$ plus the frequency of the ultrasound signal ($f_{US}$) and a second sideband at $f_{RF}$ minus the frequency of the ultrasound signal ($f_{US}$). The power in each sideband is equal to the available RF power at the tag multiplied by the backscatter efficiency, $n_{bs}$. The reradiated signal represents a modified version of the RF signal received by the tag.

The reader 110 receives the reradiated RF signal 212D (with losses due to propagation, for example) from the tag 112B. The reader demodulates the received, reradiated RF return signal 212D to recover the ultrasound. As most of the delay can be attributed to the delay caused by the ultrasound traveling from the reader to the tag (as the return from the tag to the reader is at the speed of light), the reader (which knows the time the ultrasound pulse 210A was transmitted and the time of the return RF signal carrying that pulse) determines the time delay for the ultrasound signal to travel to the tag. This time delay corresponds directly to the distance between the reader 110 and the tag 112B (e.g., distance equals rate multiplied by time). In converting from the time delay to the distance estimate, the reader may also take into other delays, such as the group delay of the reader transducer 256, the group delay of the tag transducer 266, or other time delays.

FIG. 2 at plot 299 shows a spectrogram of the RF signals received at the reader 110 at times $t_1$, $t_2$, and $t_3$. At times $t_1$ and $t_2$, the reader receives RF return signals, such as return signal 212A and 212C, without any modulation caused by the ultrasound. At time $t_3$, however, the reader receives an RF return signal 212D carrying modulation caused by the ultrasonic signal. When this is the case, the reader can detect (e.g., using a matched filter or other type of detector) the presence of the sidebands 277A-B (which were created by the ultrasound 210C) and the time of the detection (which enables the determination of the time delay for the ultrasound to travel to the tag and thus the distance to the tag).

The link budget between the reader 110 and tag 112B may be determined as follows:

$$P_{RF,Rx} = P_{RF,Tx} G^2_{ant,reader} G^2_{ant,tag} \left(\frac{\lambda_{RF}}{4\pi z}\right)^4 \eta_{bs} G_{reader} L, \quad (1)$$

where power $P_{RF,Rx}$ is the signal power captured by the reader in a single sideband, $G_{ant,reader}$ is the reader antenna gain, $G_{ant,tag}$ is the tag antenna gain, $\gamma_{RF}$ is the RF wavelength of operation, $G_{reader}$ is the net gain of the RF part of the transceiver (TRx) 252, and L is the net excess distance-independent loss. The backscatter efficiency, $n_{bs}$, is a quadratic function of the acoustic pressure $p_{inc}$ incident on the tag, and pint is inversely proportional to z in the far-field of the reader's ultrasonic transmitter. For a tag located in the far field of the reader's ultrasonic transmitter (US Tx), $P_{RF,Rx}$ is inversely proportional to $z^6$, which corresponds to a slope of −18 dB/octave.

The corresponding accuracy $\gamma z$ for the localization of a tag, such as tag 112B, may be determined according to the following:

$$\delta z = \frac{c_{US}}{\beta\sqrt{2E/N_0}} \quad (2)$$

where β is the effective bandwidth of the baseband pulse, E is the signal energy in a single received pulse, and $N_0$ is the noise power spectral density of the reader. Based on (2), δz may be considered inversely proportional to $z^3$, which corresponds to a slope of −9 dB/octave. Example values of all parameters in (1) and (2) are listed in Table I.

TABLE 1

Example link budget and localization parameters

| Symbol | Parameter | Value |
|---|---|---|
| $P_{RF,\,Rx}$ | Received RF sideband power | See (1) |
| $P_{RF,\,Tx}$ | Transmitted RF power | 30 dBm |
| $G_{ant,\,reader}$ | Reader antenna gain | 0 dB |
| $G_{ant,\,tag}$ | Tag antenna gain | 0 dB |
| $\lambda_{RF}$ | RF wavelength | 2 m |
| z | Reader-tag distance | 1-6 m |
| $\eta_{bs}$ | Backscatter efficiency | See (3) |
| $G_{reader}$ | Reader gain | 16.8 dB |
| L | Net excess loss | 5 dB |
| δz | Localization accuracy | See (2) |
| $c_{US}$ | Speed of sound | 343 m/s |
| β | Effective pulse bandwidth | 889 Hz |
| W | Pulse quarter-bandwidth | 250 Hz |
| E | Single-pulse energy | $3P_{RF,\,Rx}/W$ |
| $N_0$ | Noise power spectral density | −106 dBm/Hz |

Figure 3:
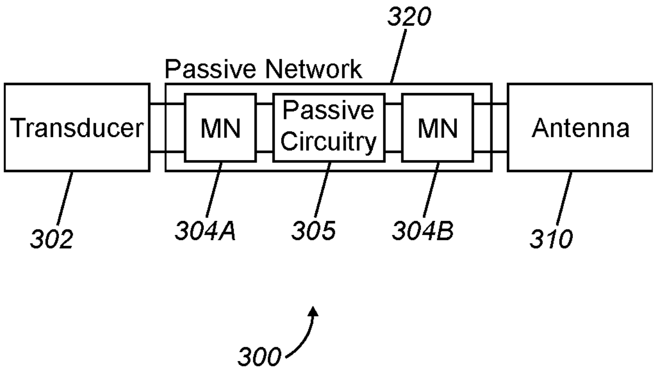
FIG. 3 depicts an example of a schematic for a tag, in accordance with some example embodiments.

FIG. 3 depicts an example of a schematic for a tag 300, in accordance with some example embodiments. The tag 300 may comprise, or be comprised in, each of tags 112A-C. In the example of FIG. 3, the tag 300 includes an ultrasonic transducer 302 coupled to an RF antenna 310 via one or more matching circuits 304A-B. In some example embodiments, the tag 300 is considered passive as it does not require a power source, such as a battery, and/or include any active components, such as an amplifier. Ultrasonic transducers generate sound waves, which are usually above about 20 kHz (or beyond the audible limit of human hearing). The ultrasonic transducer may convert ultrasonic energy or waves into an electrical signal, such as an alternating current signal and/or convert an electrical signal, such as an alternating current signal, into ultrasound. The ultrasonic transducer may be any type of device in which at least one electrical property (e.g., impedance) changes upon incident acoustic pressure; this includes plate-based transducers (such as capacitive micromachined ultrasonic transducers [CMUTs] and piezoelectric micromachined ultrasonic transducers [PMUTs]), piezoelectric transducers, electrets, electret films, and membrane-based transducers. In some example embodiments, the transducer is a CMUT. A CMUT is a transducer in which the conversion (or transduction) is caused by a change in capacitance. For example, the CMUT may be constructed on silicon using micromachining techniques. The silicon substrate contains a cavity that is capped by a thin metallized plate. If ultrasonic waves are received at the plate, the plate will vibrate, changing the capacitance of the CMUT. To generate an ultrasonic wave, an AC electrical signal combined with a DC voltage can be applied to cause the CMUT's membrane to vibrate.

As noted, the ultrasonic transducer 302 receives the incident ultrasound. In some example embodiments, the transducer 302 may be a precharged CMUT, although other types of ultrasound transducers such as regular (non-precharged) CMUTs, piezoelectric devices, piezoelectric micromachined ultrasonic transducers (PMUTs), electrets, electret films, membrane-based transducers, transducer arrays, and/or the like may be used as well. A precharged CMUT contains trapped charge on an isolated electrode that effectively biases the CMUT to provide self-sufficient high-sensitivity signal transduction.

In some example embodiments, the selection of the ultrasonic frequency ($f_{US}$) at which the tag operates is based on the motivation to maximize the transducer's fractional change in capacitance for a given incident ultrasonic pressure; this fractional capacitance change is proportional to the transducer's displacement sensitivity $S_{Rx}$, so the frequency that maximizes $S_{Rx}$ may advantageously be chosen as $f_{US}$. In some example embodiments, $f_{US}$=55.3 kHz may be selected as the ultrasonic center frequency, although other ultrasonic frequencies may be used as well. In some example embodiments, the selection of the RF frequency, $f_{RF}$, may be selected so that the RF frequency is sufficiently high to enable the use of correspondingly smaller, miniaturized antennas at the tag, while also considering the properties of the packaged tag transducer. In the case of the precharged CMUT described above for example, the impedance of the packaged CMUT above about 100 MHz may primarily be caused by the parasitics of the package itself rather than the CMUT's capacitance. Therefore, well above that frequency, any variation in this capacitance created by incident ultrasonic pressure would not significantly vary the impedance load seen by the tag's RF antenna. In those example embodiments, $f_{RF}$=145 MHz may be selected as the RF center frequency, although other RF frequencies may be used as well.

Although some of the examples refer to system operation at an RF frequency of 145 MHz and an ultrasonic frequency of 55.3 kHz, the system may be operated at other frequencies as well. In some implementations, the RF center frequency may be between 100 kHz and 100 GHz, although other ranges may be realized as well, while the ultrasound carrier frequency may be between 0.1 Hz and 10 MHz, or between 20 kHz and 1 MHz, although other ranges may be realized as well.

Referring again to FIG. 3, the RF antenna 310 may be configured to transmit and receive at an RF frequency ($f_{RF}$), which in some embodiments may be 145 MHz, although other RF frequencies may be used as well with the reader and tags. In FIG. 3, the antenna 310 may include a quarter-wave monopole, although other types of antennas and/or quantities of antennas may be used as well. For example, the antenna may include a loop, a dipole, a monopole, a patch, a slot conical, an aperture, a traveling wave antenna, an antenna array, and/or other types of antennas. In some embodiments, transducer 302, matching circuitry 304A-B, passive circuitry 305, and/or RF antenna 310 may be provided on a single substrate. In some embodiments, transducer 302 and antenna 310 may be the same device, in which case the device is configured to radiate electromagnetic waves (e.g., an RF signal) and to vibrate in response to incident ultrasound pressure.

In the example of FIG. 3, the tag 300 includes a passive network 320 that consists of matching circuitry 304A-B and additional passive circuitry 305, which together match the impedance of the transducer to that of the antenna at $f_{RF}$. For example, the first matching circuit 304A may be an L-match impedance matching circuit configured to provide impedance matching with the transducer 302, the second matching circuit 304B may also be an L-match impedance matching circuit configured to provide impedance matching with the antenna 310, and the passive circuitry 305 may be a direct electrical connection (e.g., an SMA cable). Although FIG. 3 depicts two separate matching circuits 304A-B coupled via a third passive circuit 305 for impedance matching, other quantities and/or types of matching circuits may be used as well to provide impedance matching. For example, a single impedance matching network could be used to match the impedance of the transducer to that of the antenna.

As noted, the circuitry of the tag 300 may be considered passive circuitry as it does not include any active components (e.g., an amplifier) or require an independent power source, such as a battery, to couple the transducer 302 and RF antenna 310 and then reradiate the return signal. The passive network 320 shown in FIG. 3 may be implemented such that it does not include an energy or power source.

The ultrasonic transducer 302 may be considered a device having electrical properties (e.g., capacitance) that vary as displacement caused by the ultrasound changes the physical structure of the transducer. For example, the received ultrasound may change the impedance of the ultrasonic transducer. This variation may cause the impedance load seen by the antenna 310 to change. The change in the impedance load modulates the reradiated RF return signal. In the frequency domain, this modulation caused in part by the ultrasonic transducer appears as a first sideband at the RF center frequency ($f_{RF}$) plus the ultrasound frequency ($f_{US}$) and a second sideband at the RF center frequency ($f_{RF}$) minus the ultrasound frequency ($f_{US}$). In other words, the received ultrasound causes a variation of at least one property of the ultrasonic transducer (which is coupled to the antenna). This variation of at least one property causes the RF signal which is received at the tag to be modulated such that the reradiated, return RF signal carries this modulation towards the reader. As noted, the reradiated, return RF signal represents a modified version (e.g., to include the modulation caused by the ultrasound) of the received RF signal.

Regarding the backscatter efficiency, $n_{bs}$, of the tag 300, the backscatter efficiency may be maximized (in order to maximize the amount of the received RF signal that is reradiated in the sidebands of the transmitted RF return signal) when the ultrasonic transducer 302 is impedance-matched to the antenna 310 at the RF frequency of operation, $f_{RF}$. When maximized in this way, the backscatter efficiency, $n_{bs}$, is equal to $$\eta_{bs} \approx \left(\frac{\alpha_0 p_{inc} Q}{4}\right)^2, \tag{3}$$

where $a_0$ is the pressure-normalized fractional capacitance variation of the ultrasonic transducer 302, $p_{inc}$ is the peak acoustic pressure incident on the transducer, and Q is the effective quality factor of the combination of the transducer 302, passive network 320, and antenna 310 at $f_{RF}$. In the case of the transducer 302 being a precharged CMUT, $a_0$ may be about equal to $3.02\times10^{-4}$ $Pa^{-1}$, for example.

Figure 4:
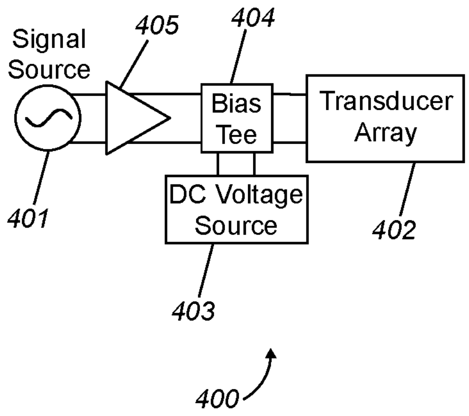
FIG. 4 depicts an example of a schematic for the reader's ultrasound transmitter, in accordance with some example embodiments.

FIG. 4 depicts an example of a schematic for the reader's ultrasound transmitter 400, in accordance with some example embodiments. The reader's ultrasound transmitter (minus the transducer(s), represented separately by 256 in FIG. 2, and by 402 in FIG. 4) may be comprised in the reader's transceiver 252. The reader's ultrasound transmitter 400 includes one or more ultrasound transducers 402. The ultrasonic transducer(s) 402 can be any type of device that emit ultrasound upon an applied electrical signal; this includes plate-based transducers (such as capacitive micromachined ultrasonic transducers [CMUTs] and piezoelectric micromachined ultrasonic transducers [PMUTs]), piezoelectric transducers, electrets, electret films, and membrane-based transducers. In some embodiments, the ultrasound transmitter 400 may include an array of broadband ultrasound transducers (e.g., seven Pro-Wave 500ES430 transducers) driven by an amplifier 405 (e.g., ADI ADHV4702-1 in a non-inverting configuration), biased by a DC voltage source 403, and interfaced to by a bias tee 404. although more or fewer ultrasound transducers may be used as well. In some embodiments, the transducer(s) 402 may not require a bias voltage, so the DC voltage source 403 would not be required and the bias tee 404 may be a direct electrical connection from the amplifier 405 to the transducer(s) 402. In some embodiments, the signal source 401 would not need to be amplified to drive the transducer(s), in which case the signal source 401 would be connected directly to the bias tee 404. In some embodiments, the bias tee 404 includes additional circuitry for impedance matching or for any other purpose related to interfacing with the transducer(s) 402.

Figure 5A:
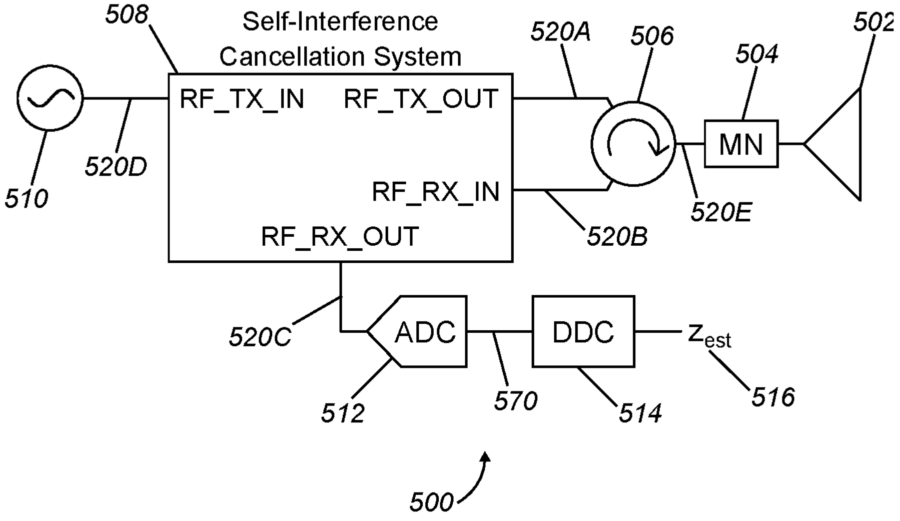
FIG. 5A depicts an example of a schematic for the reader's RF transceiver, in accordance with some example embodiments.

FIG. 5A depicts an example of a schematic for the reader's RF transceiver circuitry 500, in accordance with some example embodiments. The RF transceiver circuitry 500 (minus the antenna(s), represented separately by 254 in FIG. 2, and by 502 in FIG. 5A) may be comprised in the reader's transceiver 252. The reader's RF transceiver circuitry 500 may be configured to transmit RF signals, such as RF signals 202A, and receive RF return signals, such as RF return signals 212A, 212C, 212D, and the like.

The RF transceiver circuitry 500 may include at least one antenna, such as RF antenna 502, for receiving and transmitting RF signals. In FIG. 5A, the antenna 502 may include a quarter-wave monopole, although other types of antennas and/or quantities of antennas may be used as well. For example, one may use loop, dipole, monopole, patch, slot conical, aperture, and/or traveling wave antennas, or other types of antennas, or arrays of any of these or other types of antennas. The RF antenna may be coupled to an L-match impedance matching circuit 504 (labeled MN), although other types of impedance matching circuits may be used as well. In some embodiments, circuit 504 may be used to interface with the antenna 502 without implementing an impedance match (e.g., to implement a power match, or for any other purpose related to interfacing with the antenna).

The matching circuit 504 may be coupled to a circulator 506. In the example of FIG. 5A, a first leg (e.g., port) of the circulator 506 is coupled to an RF transmit output port (RF_TX_OUT) 520A of a self-interference cancellation circuitry 508, and a second leg of the circulator is coupled to an RF receive input port (RF_RX_IN) 520B of the self-interference cancellation circuitry 508. The self-interference cancellation circuitry's RF transmit input port (RF_TX_IN) 520D is coupled to a signal source 510. The self-interference cancellation circuitry's receive RF output port (RF_RX_OUT) 520C is provided to an analog-to-digital converter 512, which is coupled to a digital down-converter (DDC) 514. The DDC outputs $z_{est}$ (516) to indicate an estimated distance to a tag, such as tag 112B.

In the example of FIG. 5A, the signal source 510 is a 30 dBm, 145 MHz signal source that drives antenna 502 via the circulator 506 (e.g., a MACOM H350-150T circulator) and the L-match circuit 504, although the signal source may provide other powers and frequencies as well. For example, the transmitted RF power may range from −60 dBm to 50 dBm, while the range for the RF frequency may be between 100 kHz abd 10 GHz.

Figure 5B:
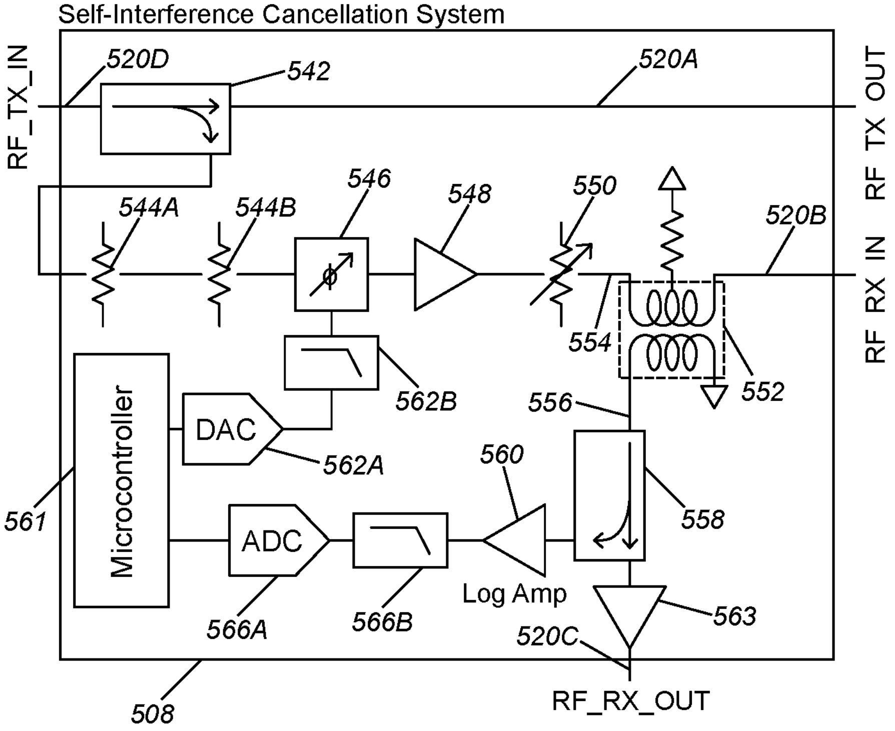
FIG. 5B depicts an example of a schematic for the reader's self-interference cancellation system, in accordance with some example embodiments.
Figure 5C:
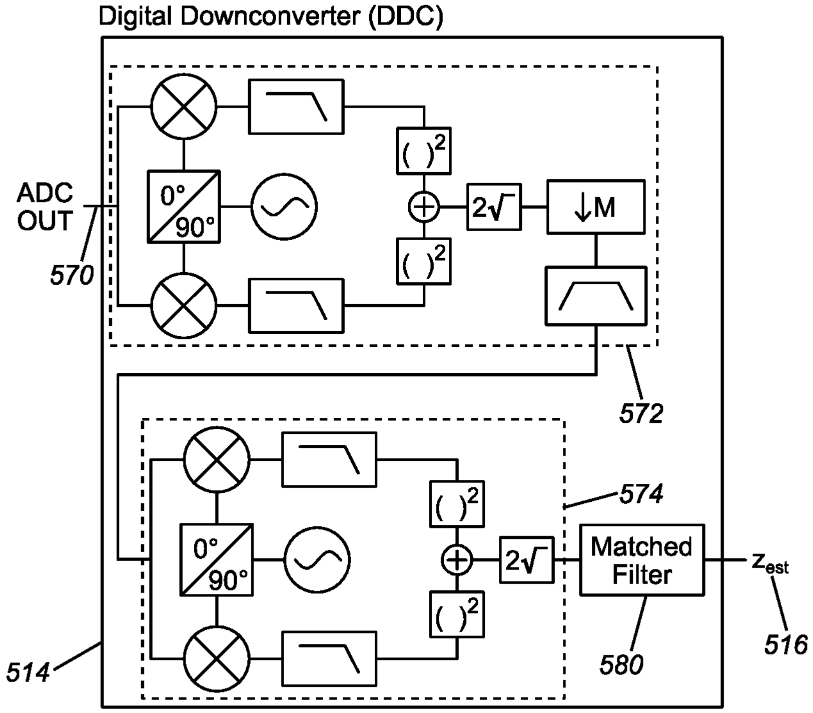
FIG. 5C depicts an example of a schematic for the reader's RF transceiver's downconverter and detection system, in accordance with some example embodiments.

In receive operation, the RF return signal from a tag is received via the antenna 502 and L-match circuit 504, and then flows into port 520E of the circulator 506 and flows out of the circulator and into the self-interference cancellation system at port 520B (RF_RX_IN). The output of the self-interference cancellation system is output at RF_RX_OUT 520C. The output 520C of the self-interference cancellation system represents the received RF return signal after self-interference cancellation. This output port at 520C is coupled to the analog-to-digital converter (ADC) 512, although in some implementations, the output port 520 signal is amplified before being provided to the ADC 512 (e.g., amplification provided internally by the self-interference cancellation circuitry 508 or amplified with an external amplifier coupled between the self-interference cancellation circuitry 508 and ADC 512). The digitized output signal 570 of the ADC 512 is then provided to downconversion and/or sideband detector circuitry, which in the example of FIG. 5A is implemented using the digital downconverter (DDC) 514. In some implementations, the DDC 514 may be implemented as a Python-based downconversion chain, an example block diagram of which is depicted at FIG. 5C.

In some embodiments, some (if not all) of the downconversion and detection functionality (which is provided by the DDC 514 in the example of FIG. 5A) may be performed in the analog/RF domain before the ADC 512 (e.g., as a block or set of blocks between the output of the self-interference cancellation receive output 520C and the input of the ADC 512). In some embodiments, at least one of the downconversion steps can be performed using negative feedback (e.g., using a Costas loop).

Because the circulator 506 isolation and antenna 502/matching network 504 return loss are not infinite, part of the originally transmitted RF signal may also appear as received signal interference in the received RF signal port 520B. This self-interference between the RF signal transmission (e.g., at 145 MHz) and desired return RF signal (e.g., at 145 MHz±55.3 kHz) may be coincident in time (as the self-interference is always present) and may not be separated widely enough in frequency to allow for filtering before downconversion. To mitigate this self-interference effect, the reader 500 may include, as shown, the self-interference cancellation circuitry 508 before digitization at the ADC 512.

The self-interference cancellation circuitry 508 samples a fraction of the generated RF power 520D, passes it through a variable attenuator 550 and/or phase shifter 546, subtracts it from the signal 520B returning from the antenna 502, samples the resulting output 556, and modifies the attenuator 550 and/or phase shifter 546 settings to minimize (or optimize) the power of the sampled output 556. FIG. 5B depicts an example implementation of the self-interference cancellation circuitry 508. As shown at FIG. 5B, a coupler 542 receives the RF_TX_IN 520D. The coupler 542 provides a portion to the RF_TX_OUT 520A (which is then transmitted via the circulator 506, matching circuit 504, and antenna 502) and provides another portion to an interference cancellation path of the self-interference cancellation circuitry 508. The interference cancellation path includes fixed attenuators 544A-B coupled to a variable phase shifter 546, which is coupled to an amplifier 548. The amplifier is coupled to a variable attenuator 550. The output 554 of the interference cancellation path is combined using a balun 552 with the return signal 520B (e.g., the received RF return signal from the antenna 502). The balun's output 556 is coupled (via coupler 558) to a logarithmic amplifier 560 to monitor the post-cancellation power. An optimization algorithm (e.g., a greedy optimization algorithm) may be implemented on a microcontroller 561 (e.g., an Arduino Due) to automatically adjust the variable phase shifter 546 and variable attenuator 550 settings to minimize (or optimize) the post-cancellation power. The phase shifter 546 may be driven by a digital to analog converter 562A via a low-pass filter 562B, and the output voltage of the log amp 560 may be measured with an analog to digital converter 566A via a low-pass filter 566B. The self-interference cancellation circuitry's output at 520C (RF_RX_OUT) represents the received RF return signal with at least a portion of the interference caused by the transmitted RF signal removed.

FIG. 5C depicts an example implementation of a DDC such as DDC 514, in accordance with some example embodiments. The DDC circuit in this example includes two-stage downconversion. The first stage 572 receives digital data output 570 from the ADC, performs frequency downconversion by multiplying the signal by $f_{RF}$ in quadrature, downsamples the downconverted signal, and filters the downsampled signal to isolate the sideband signals centered at plus and minus $f_{US}$. The second stage 574 further downconverts by multiplying the signal by $f_{US}$ in quadrature and combines the sideband signals to baseband, where matched filter 580 detects the presence of the sideband signals when present.

Figure 6A:
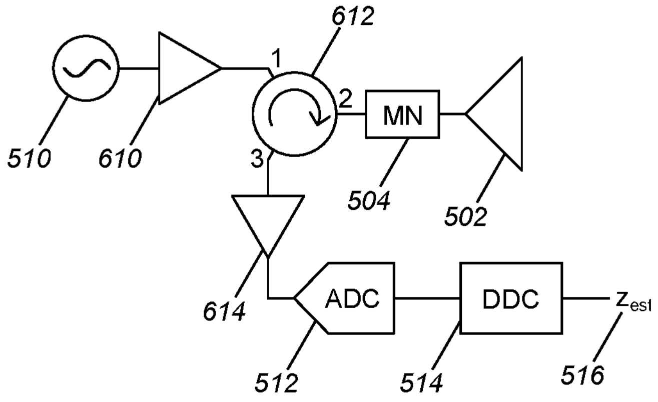
FIGS. 6A, 6B, 6C, and 6D depict examples of RF transceiver implementations for the reader, in accordance with some example embodiments.

FIG. 6A depicts another example of a reader such as reader 110, in accordance with some example embodiments. In the example of FIG. 6A, the reader includes a monostatic circulator-based architecture without self-interference cancellation. In the example of FIG. 6A, the signal source 510 provides a signal, such as a CW signal, which is amplified by amplifier 610 before entering port 1 of circulator 612. The signal received at port 1 is output at port 2 of the circulator 612 and is transmitted via the matching network 504 and the antenna 502 towards the passive tags. The return RF signal reradiated by a passive tag is captured by the reader antenna 502, passes through the matching network 504, flows into port 2 of the circulator, and is output at port 3 of the circulator. The output of port 3 is provided to an amplifier 614, ADC 512, and DDC 514 for processing as described above with respect to FIG. 5A.

Figure 6B:
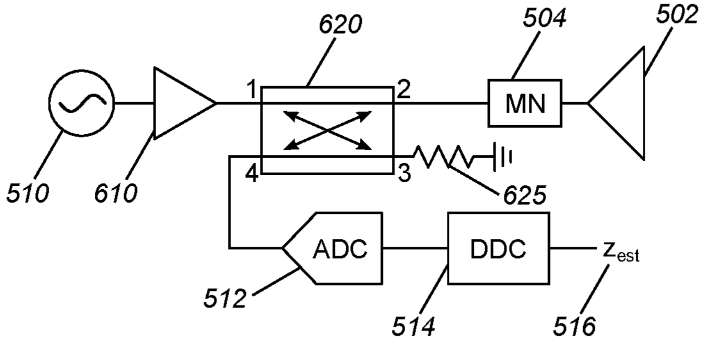

FIG. 6B depicts another example of a reader such as reader 110, in accordance with some example embodiments. The embodiment of FIG. 6B depicts a monostatic directional coupler-based architecture without self-interference cancellation. The RF signal source 510 provides a CW signal which is amplified at 610 and passes into port 1 of the directional coupler 620. A portion of the input signal at port 1 passes out of port 2 of the directional coupler 620. Some of the input signal coming into port 1 is coupled to port 3 where it is absorbed by a load, such as resistor 625. The output of port 2 is transmitted via the matching network 504 and the antenna 502 towards the passive tags. The return RF signal reradiated by a passive tag is captured by the reader antenna 502, passes through the matching network 504, and enters into port 2 of the directional coupler 620. Some of this signal passes out of port 4 of the coupler 620. The output of port 4 may be amplified before being provided to ADC 512 and DDC 514 for processing as described above with respect to FIG. 5A.

Figure 6C:
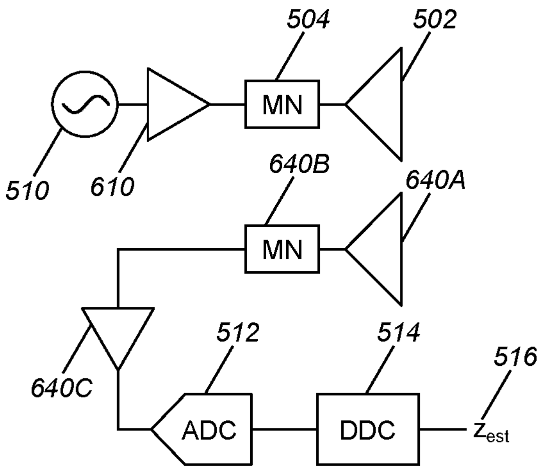

FIG. 6C depicts another example of a reader such as reader 110, in accordance with some example embodiments. The embodiment of FIG. 6C depicts a bistatic architecture without self-interference cancellation. In the example of FIG. 6C, the RF signal source 510 provides a signal, such as a CW signal, which is provided to amplifier 610 before transmission, via the matching network 504 and antenna 502, towards the passive tags. The RF return signals from the tags may be received by an antenna 640A, a matching network 640B, and then amplified by amplifier 640C before being digitized and processed by 512 and 514 to provide the location information 516. In the example of FIG. 6C, the transmit chain 510, 610, 504, and 502 are separate from the receive chain 640A, 640B, 640C, 512, and 514 to provide some receive-transmit isolation.

Figure 6D:
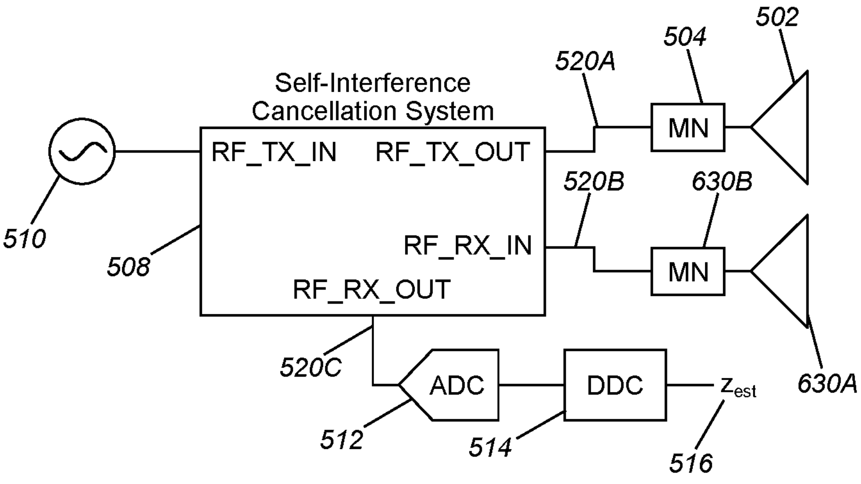

FIG. 6D depicts another example of a reader such as reader 110, in accordance with some example embodiments. The embodiment of FIG. 6D depicts a bistatic architecture with self-interference cancellation. The RF signal source 510 may provide a CW signal (which passes through the self-interference cancellation circuit 508) before transmission via matching network 504 and antenna 502. The RF return signals reradiated from a tag may be captured by the receiving antenna 630A, go through the receiving antenna matching network 630B, and be input at 520B to the self-interference cancellation circuit 508. The post-interference-cancellation modulated RF return signal is output at 520C, digitized 512, and downconverted 514 to result in an estimate of the reader-tag distance.

Figure 7A:
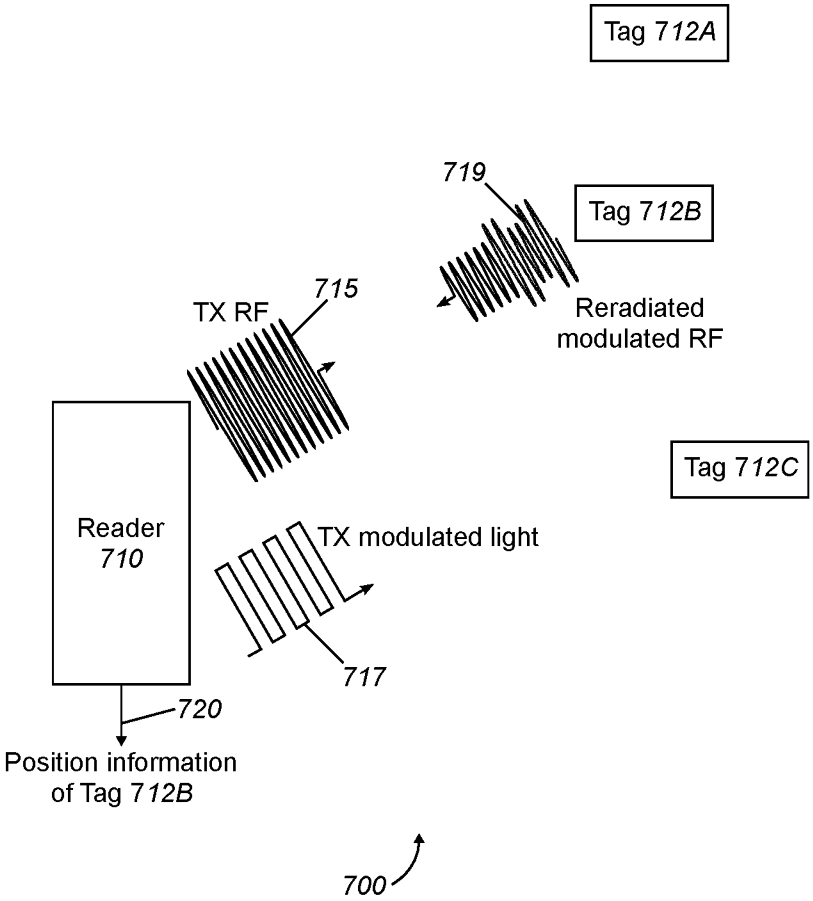
FIGS. 7A, 7B, 7C, and 7D depict example parts of a tag localization system using light instead of ultrasound, in accordance with some example embodiments.

FIG. 7A depicts an example of a tag localization system 700, in accordance with some example embodiments. The system 700 may include a reader 710 and a plurality of tags, such as tags 712A-C. The reader may transmit a radio frequency (RF) signal 715 and an optical signal 717, which may be modulated, as depicted in FIG. 7A. The RF signal and optical signal may be received by at least one of the tags, such as tag 712B. When the tag 712B receives (e.g., detects) the optical signal, the optical signal (which changes the properties of the photodiode 722) modulates the RF signal received at the tag, such that the reradiated RF return signal 719 carries the modulation caused by the optical signal. As described further herein, as the photodiode's properties are changed by the received optical signal, the reradiated RF return signal is modulated. For example, if the radio frequency (RF) signal 715 is centered at 145 MHz ($f_{RF}$), the reradiated RF return signal will be centered at 145 MHz ($f_{RF}$) and include a first RF sideband at 145 MHz plus the frequency of the modulation of the optical signal ($f_{mod}$) and a second RF sideband at 145 MHz minus the frequency of the modulation of the optical signal ($f_{mod}$). The reader 710 receives the RF return signal 719 and may detect the presence of the sidebands caused by the optical signal modulation (e.g., using matched filter detection or another type of detection). The time a sideband is detected may be used to determine an estimate for the time for the optical signal 717 to travel from the reader 710 to tag 712B, plus the time for the reradiated modulated RF signal 719 to travel back from tag 712B to reader 710. This round-trip travel time directly corresponds to an estimated distance between the reader 710 and tag 712B. In this way, the reader 710 may be used to determine and thus provide the location or position information, such as distance, for tag 712B. In some embodiments, the optical signal may create a single sideband in the reradiated RF signal 115 at either 145 MHz plus the frequency of the modulation of the optical signal or 145 MHz minus the frequency of the modulation of the optical signal; the reader 110 may detect the presence of a single sideband and/or use its time-of-arrival to determine an estimate for the distance to the tag 112B."

Although FIG. 7A depicts a single reader, the tag localization system 700 may include a plurality of readers as well. Moreover, although three tags are depicted at FIG. 7A, other quantities of tags may be implemented as well.

Figure 7B:
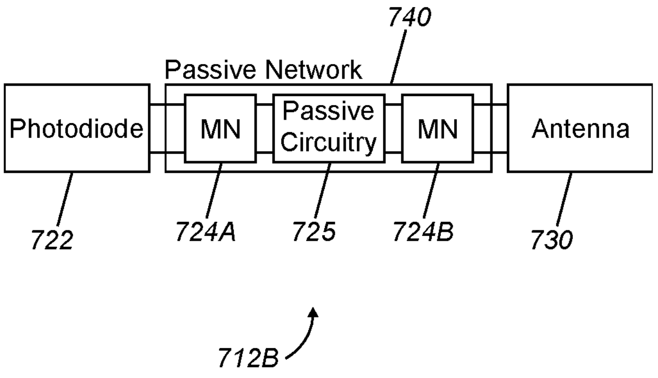

FIG. 7B depicts an example of a schematic for a tag 712B (or 712A, or 712C), in accordance with some example embodiments. In the example of FIG. 7B, the tag 712B includes a photodiode 722 coupled to an RF antenna 730 via one or more matching circuits 724A-B. In some example embodiments, the tag 712B is considered passive as it does not require a power source, such as a battery, and/or include any active components, such as an amplifier. The photodiode 722 may be any type of device in which at least one electrical property (e.g., impedance) changes upon incident light; this includes solar cells, p-n junction diodes, p-i-n junction diodes, LEDs, photoresistors, or any other device sensitive to light, and may be fabricated in silicon, germanium, gallium arsenide, or any other semiconductor or organic material that supports such devices. In some example embodiments, the photodiode 722 is a silicon p-n junction diode constructed in a CMOS process. The tag 712B may be constructed such that the photodiode 722 is open-circuited at the optical modulation frequency $f_{mod}$; this allows the depletion width to change upon light 717 being incident on the photodiode 722, which changes the impedance of the photodiode 722 as seen by the tag antenna 730 and passive network 740. In some embodiments, this open-circuit condition can be guaranteed by implementing at dipole or other structure that is open-circuit at low frequencies as the tag antenna 730. In some embodiments, this open-circuit condition can be guaranteed by implement a DC block in the tag passive network 740 (e.g., using a series capacitor).

In some example embodiments, the selection of the optical wavelength is based on the motivation to maximize the amplitude of the received energy at the sidebands of the return RF signal 719 for a given reader-tag distance. In some embodiments, the selection of the optical wavelength and emitted intensity is based on eye and/or skin safety limits. In some implementations, the optical wavelength may be between 300 nm and 10 though other wavelengths may be used as well.

In some example embodiments, the selection of the optical modulation frequency ($f_{mod}$) is based on the motivation to maximize the photodiode's fractional change in impedance for a given incident light intensity. In some example embodiments, $f_{mod}$=100 kHz may be selected as the optical modulation frequency, although other frequencies may be used as well. In some example embodiments, the selection of the RF frequency, $f_{RF}$, may be selected so that the RF frequency is sufficiently high to enable the use of correspondingly smaller, miniaturized antennas at the tag, while also considering the properties of the packaged tag photodiode. If, for example, the impedance of the packaged photodiode above about 100 MHz is primarily determined by the parasitics of the package itself rather than the photodiode's impedance, then, well above that frequency, any variation in this impedance created by incident light would not significantly vary the impedance load seen by the tag's RF antenna. In those example embodiments, $f_{RF}$=145 MHz may be selected as the RF center frequency, although other RF frequencies may be used as well.

Although some of the examples refer to system operation at an RF frequency of 145 MHz and an optical modulation frequency of 100 kHz, the system may be operated at other frequencies as well. In some implementations, the RF center frequency may be between 100 kHz and 100 GHz, although other ranges may be realized as well, while the optical modulation frequency may be between 1 Hz and 1 GHz, although other ranges may be realized as well.

Referring again to FIG. 7B, the RF antenna 730 may be configured to transmit and receive at an RF frequency ($f_{RF}$), which in some embodiments may be 145 MHz, although other RF frequencies may be used as well with the reader and tags. In FIG. 7B, the antenna 310 may include a quarter-wave monopole, although other types of antennas and/or quantities of antennas may be used as well. For example, the antenna may include a loop, a dipole, a monopole, a patch, a slot conical, an aperture, a traveling wave antenna, an antenna array, and/or other types of antennas. In some embodiments, photodiode 722, matching circuitry 724A-B, passive circuitry 725, and/or RF antenna 730 may be provided on a single substrate. In some embodiments, photodiode 722 and antenna 730 may be the same device, in which case the device is configured to radiate electromagnetic waves (e.g., an RF signal) and to have a change in properties in response to incident light.

In the example of FIG. 7B, the tag 712B includes a passive network 740 that consists of matching circuitry 724A-B and additional passive circuitry 725, which together match the impedance of the photodiode to that of the antenna at $f_{RF}$. For example, the first matching circuit 724A may be an L-match impedance matching circuit configured to provide impedance matching with the photodiode 722, the second matching circuit 724B may also be an L-match impedance matching circuit configured to provide impedance matching with the antenna 730, and the passive circuitry 725 may be a direct electrical connection (e.g., an SMA cable). Although FIG. 7B depicts two separate matching circuits 724A-B coupled via a third passive circuit 725 for impedance matching, other quantities and/or types of matching circuits may be used as well to provide impedance matching. For example, a single impedance matching network could be used to match the impedance of the photodiode to that of the antenna.

As noted, the circuitry of the tag 712B may be considered passive circuitry as it does not include any active components (e.g., an amplifier) or require an independent power source, such as a battery, to couple the photodiode 722 and RF antenna 730 and then reradiate the return signal. The passive network 740 shown in FIG. 7B may be implemented such that it does not include an energy or power source.

The photodiode 722 may be considered a device having electrical properties that vary as charge movement caused by incident light changes the depletion width of the photodiode. For example, the received light may change the impedance of the photodiode. This variation may cause the impedance load seen by the antenna 730 to change. The change in the impedance load modulates the reradiated RF return signal. In the frequency domain, this modulation caused in part by the photodiode appears as a first sideband at the RF center frequency ($f_{RF}$) plus the optical modulation frequency ($f_{mod}$) and a second sideband at the RF center frequency ($f_{RF}$) minus the optical modulation frequency ($f_{mod}$). In other words, the received light causes a variation of at least one property of the photodiode (which is coupled to the antenna). This variation of at least one property causes the RF signal which is received at the tag to be modulated such that the reradiated, return RF signal carries this modulation towards the reader. As noted, the reradiated, return RF signal represents a modified version (e.g., to include the modulation caused by the photodiode) of the received RF signal.

Regarding the backscatter efficiency, $n_{bs}$, of the tag 712B, the backscatter efficiency may be maximized (in order to maximize the amount of the received RF signal that is reradiated in the sidebands of the transmitted RF return signal) when the photodiode 722 is impedance-matched to the antenna 730 at the RF frequency of operation, $f_{RF}$.

Figure 7C:
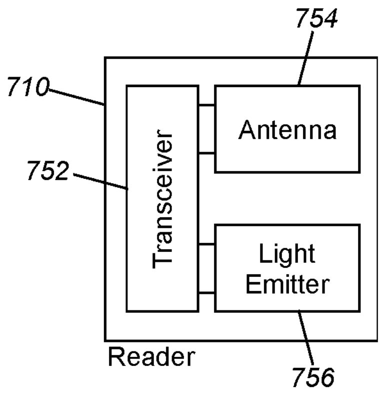

FIG. 7C depicts an example of a schematic for the reader 710, in accordance with some example embodiments. The reader 710 emits CW RF signals and pulsed optical signals towards the tags 712A-C. The RF part of the reader architecture and downconversion chain may be similar to the readers disclosed herein as in the examples depicted in FIGS. 5A-C and FIGS. 6A-D.

In some example embodiments, the reader 710 of FIG. 7C may include one or more light emitters 756 configured to transmit an optical signal towards a tag, such as tags 712A-C) being located by the reader. The reader may also include an antenna 754, configured to transmit a first radio frequency signal towards the tag. This antenna may also receive a second radio frequency signal from a tag, wherein the second radio frequency signal includes a modulation caused by the optical signal received by the tag. The reader may also include detection circuitry (similar to the DDC or other examples noted above) configured to detect the modulation and provide an indication of a presence of the modulation and/or an indication of a distance to the tag.

The one or more readers 710 may localize the one or more tags 712A-C in a variety of ways. In some embodiments, the reader may perform time-of-flight-based localization by measuring $t_d$, which is the time difference between when the pulsed light is emitted and when it is detected in the modulation of the received RF signal. The distance from the reader to the tag would then be $t_d/(2c_{light})$, where $c_{light}$ is the speed of light. As described further with respect to FIG. 8B, using at least 3 readers with only time-of-flight measurement capability, the reader may recover the position of tags. In some embodiments, the reader may perform angle-of-arrival-based localization by steering an RF beam (in the transmit or receive mode) and/or steered optical signal (electronically with a phased array or mechanically with a steered LED or laser, for example) to determine and recover the angles that each tag makes with each reader and suitably defined axes. FIG. 8C describes using at least 2 readers with only angle-of-arrival measurement capability to recover the position of tags. As described with respect to FIG. 8A, a single reader with both time-of-arrival and angle-of-arrival measurement capability may be used to recover the position of tags.

In some example embodiments, each of the tags 712A-C may be configured to receive a first RF signal and receive an optical signal transmitted by the light emitter 756 at the reader. The tag may include a photodiode (which receives the optical signals transmitted by the reader) coupled, via a passive electrical circuit, to an RF antenna at the tag. This passive electrical circuit may impedance-match the photodiode to the tag's antenna at $f_{RF}$. The incident light received by the photodiode varies the load impedance seen by the tag's antenna, changing the depletion width of the tag's photodiode. The reader 710 emits CW RF signals and pulsed optical signals towards the tags 712A-C.

Figure 7D:
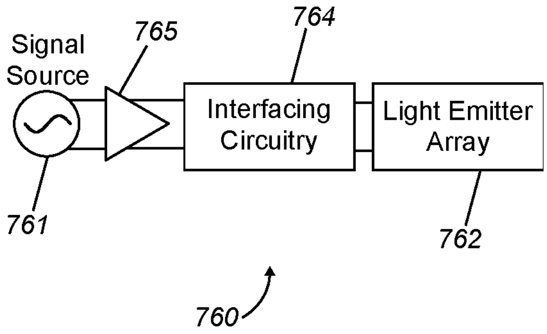

FIG. 7D depicts an example of a schematic for the reader's optical transmitter 760, in accordance with some example embodiments. The reader's optical transmitter (minus the light emitter(s), represented separately by 756 in FIG. 7C, and by 762 in FIG. 7D) may be comprised in the reader's transceiver 752. The reader's optical transmitter 760 includes one or more light-emitting devices 762. The light-emitted device(s) 762 can be any type of device that emit light upon an applied electrical signal; this includes LEDs, lasers, and incandescent bulbs. In some embodiments, the light emitter array 762 may include an array of light-emitting devices driven by an amplifier 765 and interfaced to by interfacing circuitry 764. In some embodiments, the amplifier 765 may not require further interfacing with the light emitter array 762, so the interfacing circuitry 764 may be a direct electrical connection from the amplifier 765 to the light emitter array 762. In some embodiments, the signal source 761 would not need to be amplified to drive the light emitter array 762, in which case the signal source 761 would be connected directly to the interfacing circuitry 764. In some embodiments, the interfacing circuitry 764 includes additional circuitry for impedance matching or for any other purpose related to interfacing with the light emitter array 762.

Although some of the examples depict a 1-dimensional localization of tag 112B providing a distance to tag 112B, the position of tag 112B may be further localized to 2 or 3 dimensions.

Figure 8A:
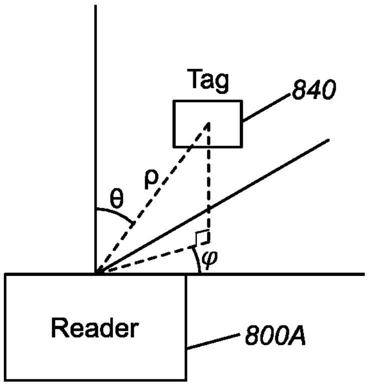
FIGS. 8A, 8B, and 8C depict examples of localization of a tag in one, two, and three dimensions, in accordance with some example embodiments.

FIG. 8A depicts an example of a single reader 800A with range and angle determination, in accordance with some example embodiments. In addition to time-of-flight-based ranging for 1D localization (to find ρ), the reader can electronically or mechanically steer the RF, ultrasound, or optical beams in order to find the azimuth and elevation angles to the tag 840 (φ and θ, respectively). Electronic beamforming may be performed using RF, ultrasonic, or optical phased arrays on the reader, and may use beam steering techniques. In some embodiments, RF, ultrasonic, and/or optical beams may be mechanically steered. With knowledge of ρ, φ and θ, and assuming that the reader is located at $r_{reader}=(0,0,0)$, the tag's position $r_{tag}$ may be determined based on:

$$r_{tag}=(\rho\sin\theta\cos\varphi,\ \rho\sin\theta\sin\varphi,\ \rho\cos\theta). \tag{5}$$

Figure 8B:
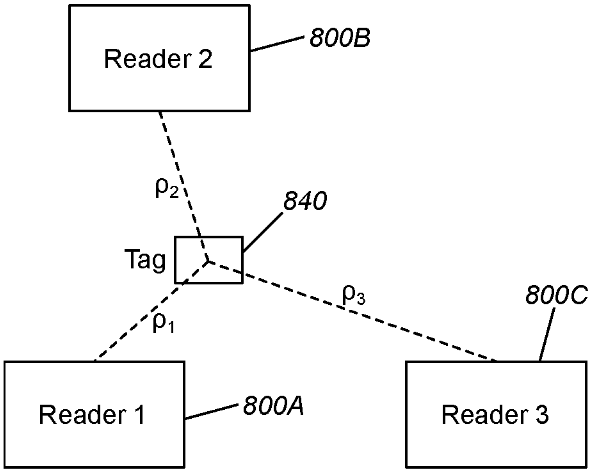
Figure 8C:
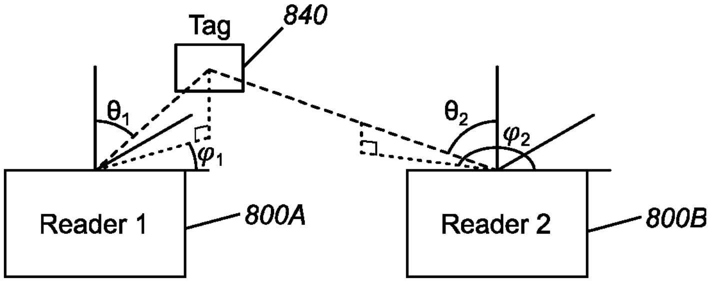

FIG. 8B depicts an example of multilateration with multiple readers 800A-C each with range determination, in accordance with some example embodiments. If each reader is designed to perform only time-of-flight-based ranging for 1D localization (to find each ρ in FIG. 8B), three readers may be used to combine the range information from each reader to determine the position of the tag 840 unambiguously, assuming that it is known that the tag 840 lies on one side of the plane formed by the three readers (if this is not known, a fourth reader can resolve the ambiguity). This is because three spheres whose centers are not collinear intersect at exactly two points, those points being symmetric with respect to the plane formed by the spheres' centers. With knowledge of $\rho_1$, $\rho_2$, and $\rho_3$, assuming that the readers are located at $r_{reader,1}=(0,0,0)$, $r_{reader,2}=(x_2, y_2, 0)$, and $r_{reader,3}=(x_3,0,0)$, and assuming that the tag 840 lies below the plane formed by the readers (which would be the case if the readers are mounted on the ceiling of a room, for example), the tag's position $r_{tag}=(x_{tag},y_{tag},z_{tag})$ may be determined based on the following:

$$x_{tag}=\frac{\rho_1^2-\rho_3^2+x_3^2}{2x_3} \tag{8}$$

$$y_{tag}=\frac{\rho_1^2-\rho_2^2-2x_{tag}x_2+x_2^2+y_2^2}{2y_2}$$

$$z_{tag}=-\sqrt{\rho_1^2-x_{tag}^2-y_{tag}^2}$$

FIG. 8C depicts an example of multiangulation with multiple readers 800A-B, each with angle determination, in accordance with some example embodiments. If each reader is designed to perform only angle estimation (to find φ and θ in FIG. 8C, rather than the reader-tag distances directly), using two readers would allow the system to combine the angle information from each reader to determine the position of the tag 840 unambiguously. This is because two different rays can intersect at no more than one point in space. Angle estimation may be performed using beam steering. With knowledge of $\varphi_1$, $\theta_1$, $\varphi_2$, and $\theta_2$, and assuming that the readers are located at $r_{reader,1}=(0,0,0)$ and $r_{reader,2}=(x_2,0,0)$, the tag's position $r_{tag}=(x_{tag},y_{tag}, z_{tag})$ may be determined as follows:

$$r_{tag}=(\rho_1\sin\theta_1\cos\varphi_1,\ \rho_1\sin\theta_1\sin\varphi_1,\ \rho_1\cos\theta_1), \tag{7}$$

where $$\rho_1=\frac{x_2}{\cos\theta_1(\tan\theta_1\cos\varphi_1-\tan\theta_2\cos\varphi_2)} \tag{8}$$

In some example embodiments, there is provided a passive tag. The tag may include an antenna configured to receive a radio frequency signal and to reradiate a modified version of the received radio frequency signal. The passive tag may include an ultrasonic transducer coupled to the antenna. An ultrasound signal received by the ultrasonic transducer may cause a variation of at least one property of the ultrasonic transducer. This variation may impart a modulation onto the portion of the received radio frequency signal that is reradiated by the antenna.

In some example embodiments, the passive tag may receive a RF signal. The passive tag may impart or cause a modulation to be imparted on to the received radio frequency signal. And, the passive tag may then transmit, such as reradiate, the modulated signal. For example, if the radio frequency (RF) signal 115 is that is received is centered at $f_{RF}$ and the ultrasound is at $f_{US}$, the passive tag modules the received signal based on the ultrasound, and then transmits an RF signal centered at $f_{RF}$ with a first RF sideband at $f_{RF}$ plus $f_{US}$ and a second RF sideband at $f_{RF}$ minus $f_{US}$.

In some example embodiments, the reader may include an ultrasonic transducer configured to transmit an ultrasound signal towards a passive tag being located by the system. The reader may also include at least one antenna configured to transmit a first radio frequency signal towards the passive tag and receive a second radio frequency signal from the passive tag, the second radio frequency signal including a modulation caused by the ultrasound signal received by the passive tag. The reader may also include detection circuitry to detect the modulation and provide an indication of a presence of the modulation on the received second radio frequency signal and/or an indication of a distance to the passive tag.

Although some examples refer to the tag as a passive tag, some embodiments may include power or an active device such as an amplifier.

In some example embodiments, there is provided a method. The method may include receiving, by an antenna at a tag such as a passive tag, a first radio frequency signal. The method may also include transmitting, by the antenna at the tag, a second radio frequency signal, wherein the second radio frequency signal is varied by an ultrasound signal received by an ultrasonic transducer coupled to the antenna and/or varied by an optical signal received by a photodiode.

In some example embodiments, there is provided a method. The method may include transmitting a first signal towards a tag being located by the system, the first signal comprising an ultrasound signal generated by an ultrasonic transducer and/or an optical signal generated by an optical emitter. The method may also include transmitting, by at least one antenna, a first radio frequency signal towards the tag. The method may also include receiving a second radio frequency signal from the tag, the second radio frequency signal including a modulation caused by the ultrasound signal received by the tag and/or the optical signal received by the tag. And, the method may include detecting the modulation and providing an indication of a presence of the modulation on the received second radio frequency signal and/or an indication of a distance to the tag.

The subject matter described herein can be embodied in systems, apparatus, methods, and/or articles depending on the desired configuration. The implementations set forth in the foregoing description do not represent all implementations consistent with the subject matter described herein. Instead, they are merely some examples consistent with aspects related to the described subject matter. Although a few variations have been described in detail above, other modifications or additions are possible. In particular, further features and/or variations can be provided in addition to those set forth herein. For example, the implementations described above can be directed to various combinations and subcombinations of the disclosed features and/or combinations and subcombinations of several further features disclosed above. In addition, the logic flows depicted in the accompanying figures and/or described herein do not necessarily require the particular order shown, or sequential order, to achieve desirable results. Other implementations may be within the scope of the following claims.

What is claimed is:

1. A tag comprising:

an antenna configured to receive a first radio frequency signal from a reader, and wherein the antenna is configured to reradiate a second radio frequency signal; and an ultrasonic transducer coupled to the antenna, wherein an ultrasound signal received by the ultrasonic transducer causes a variation of at least one property of the ultrasonic transducer, wherein the variation of the at least one property imparts a modulation onto at least a portion of the first radio frequency signal by creating a sideband in the second radio frequency signal that is offset from a carrier of the second radio frequency signal by an offset corresponding to an ultrasound frequency component of the ultrasound signal, wherein a magnitude of the sideband varies as a function of a magnitude of the variation of the at least one property, and wherein the modulated first radio frequency signal is reradiated by the antenna as the second radio frequency signal, wherein a time of travel associated with the sideband provides information associated with a distance between the tag and the reader, wherein the tag is passive, wherein the tag does not include a battery and/or a powered or an active component.

2. The tag of claim 1, wherein the at least one property is an electrical property of the ultrasonic transducer.

3. The tag of claim 2, wherein the electrical property includes at least an impedance of the ultrasonic transducer.

4. The tag of claim 1, wherein the tag further comprises at least one matching circuit to provide impedance matching between the antenna and the ultrasonic transducer.

5. The tag of claim 1, wherein the first radio frequency signal comprises a continuous wave radio frequency signal, and wherein the ultrasound signal received by the ultrasonic transducer comprises a pulsed signal.

6. The tag of claim 1, wherein the ultrasonic transducer comprises a piezoelectric transducer or a capacitive transducer.

7. The tag of claim 1, wherein the ultrasonic transducer comprises a capacitive micromachined ultrasonic transducer.

8. The tag of claim 1, wherein the second radio frequency signal is the first radio frequency with the created sideband.

9. A system comprising:

an ultrasonic transducer configured to transmit an ultrasound signal towards a tag being located by the system, wherein the tag is passive, wherein the tag does not include a battery and/or a powered or an active component;

an antenna configured to transmit a first radio frequency signal towards the tag and receive a second radio frequency signal from the tag, the second radio frequency signal including a modulation of at least a portion of the first radio frequency signal by creating a sideband caused by the ultrasound signal received by the tag; and detection circuitry to detect the modulation and configured to:

filter the second radio frequency signal to isolate the sideband corresponding to a frequency of the ultrasound signal transmitted by the ultrasonic transducer;

convert the sideband to a baseband representation;

perform matched filter detection on the baseband representation to generate a matched filter output; and provide an indication of a distance to the tag based on a time of travel associated with the sideband, wherein the time of travel is based on a time of a peak of the matched filter output, and wherein the detection circuitry further includes a self-interference cancellation circuitry to remove self-interference portion of the second radio frequency signal prior to demodulation of the second radio frequency signal.

10. The system of claim 9, wherein the indication of a distance corresponds to the measured time for the ultrasound signal to travel from the system to the tag.

11. The system of claim 9, wherein the detection circuitry comprises digital down conversion circuitry.

12. The system of claim 9 further comprising:

a circulator coupled to the antenna;

the self-interference cancellation circuitry coupled to the circulator; and an analog-to-digital converter coupled to the self-interference cancellation circuitry and the detection circuitry.

13. The system of claim 9, wherein the system includes a plurality of antennas, wherein the system includes a plurality of ultrasonic transducers, and/or wherein the ultrasonic transducer comprises an array of ultrasonic transducers.

14. The system of claim 9 further comprising:

a plurality of tags, wherein at least one of the tags is passive, such that the tag does not include a battery and/or a powered, active device.

15. A method comprising:

transmitting a first signal towards a tag being located, the first signal comprising an ultrasound signal generated by an ultrasonic transducer and/or an optical signal generated by an optical emitter, wherein the tag is passive, wherein the tag does not include a battery and/or a powered or an active component;

transmitting, by at least one antenna, a first radio frequency signal towards the tag;

receiving a second radio frequency signal from the tag, the second radio frequency signal including a modulation of at least a portion of the first radio frequency signal by creating a sideband caused by the ultrasound signal that is received by the tag and/or the optical signal that is received by the tag;

detecting the modulation;

filtering the second radio frequency signal to isolate the sideband corresponding to a frequency of the ultrasound signal transmitted by the ultrasonic transducer;

converting the sideband to a baseband representation;

performing matched filter detection on the baseband representation to generate a matched filter output; and providing an indication of a distance to the tag based on a time of travel associated with the sideband, wherein the time of travel is based on a time of a peak of the matched filter output.

* * * * *